(12) United States Patent
Chu et al.

(10) Patent No.: US 7,323,752 B2
(45) Date of Patent: Jan. 29, 2008

(54) ESD PROTECTION CIRCUIT WITH FLOATING DIFFUSION REGIONS

(75) Inventors: Yu-Hung Chu, Hsin Chu County (TW); Shao-Chang Huang, Hsinchu (TW); Ming-Hsiang Song, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/956,795

(22) Filed: Sep. 30, 2004

(65) Prior Publication Data

US 2006/0065933 A1    Mar. 30, 2006

(51) Int. Cl.
  *H01L 23/62*   (2006.01)
  *H02H 9/04*    (2006.01)
  *H02H 3/20*    (2006.01)

(52) U.S. Cl. .............. 257/360; 361/56; 361/91.5; 257/E29.255

(58) Field of Classification Search ........... 257/355, 257/356, 360, 546, 361, E29.255; 361/56, 361/100, 101, 111, 91.5
See application file for complete search history.

(56) References Cited

U.S. PATENT DOCUMENTS

| | | | |
|---|---|---|---|
| 6,433,368 B1 * | 8/2002 | Vashchenko et al. | 257/173 |
| 6,879,005 B2 * | 4/2005 | Yamaguchi et al. | 257/367 |
| 6,963,111 B2 * | 11/2005 | Reddy et al. | 257/356 |
| 6,975,015 B2 * | 12/2005 | Voldman et al. | 257/585 |
| 7,005,708 B2 * | 2/2006 | Mergens et al. | 257/360 |
| 2001/0007521 A1 * | 7/2001 | Chen | 361/56 |
| 2003/0076645 A1 * | 4/2003 | Ker et al. | 361/111 |
| 2003/0189230 A1 * | 10/2003 | Hung et al. | 257/355 |
| 2003/0197225 A1 * | 10/2003 | Chen et al. | 257/355 |
| 2003/0197246 A1 * | 10/2003 | Ker et al. | 257/565 |
| 2005/0012155 A1 * | 1/2005 | Ker et al. | 257/355 |
| 2006/0044718 A1 * | 3/2006 | Su et al. | 361/56 |

* cited by examiner

*Primary Examiner*—Lynne Gurley
*Assistant Examiner*—Andrew O. Arena
(74) *Attorney, Agent, or Firm*—Duane Morris LLP (57) ABSTRACT

This invention discloses an electrostatic discharge (ESD) protection circuit that comprises a substrate of a predetermined type, at least one MOS transistor being coupled to a pad of an integrated circuit for dissipating an ESD current from the pad during an ESD event, a substrate contact region, and at least one floating diffusion region formed in a substrate area between the MOS transistor and the substrate contact region for reducing a trigger-on voltage of the MOS transistor during the ESD event.

22 Claims, 8 Drawing Sheets

ESD PROTECTION CIRCUIT WITH FLOATING DIFFUSION REGIONS

BACKGROUND

The present invention relates generally to integrated circuit designs, and more particularly to an electrostatic discharge (ESD) protection circuit having floating diffusion regions to improve ESD performance for protecting the core circuit of an integrated circuit (IC) from damage that may be caused by an ESD event.

The gate oxide of a metal-oxide-semiconductor (MOS) transistor of an IC is most susceptible to damage. The gate oxide may be destroyed by being contacted with a voltage only a few volts higher than the supply voltage. It is understood that a regular supply voltage in an integrated circuit is 5.0, 3.3 volts, or even lower. Electrostatic voltages from common environmental sources can easily reach thousands, or even tens of thousands of volts. Such voltages are destructive because the charge and any resulting current are extremely large in the transient. For this reason, it is of critical importance to discharge any static electric charge.

ESD protection circuit is typically added to integrated circuits (ICs) at the bond pads. The pads are the connections to outside circuits, for all electric power supplies, electric grounds, and electronic signals. Such added circuits must allow normal operation of the IC. It means that a protective circuit is effectively isolated from the normally operating core circuit because it blocks current flow through itself to ground, or any other circuit, or pad. In an operating IC, electric power is supplied to a VCC pad, electric ground is supplied to a VSS pad, electronic signals are supplied from outside to some pads, and electronic signals generated by the core circuit of the IC are supplied to other pads for delivery to external circuits and devices. In an isolated, unconnected IC, all pads are considered to be electrically floating, or of indeterminate voltage. In most cases, this means the pads are at ground, or zero voltage.

ESD can arrive at any pad. This can happen, for example, when a person touches some of the pads on the IC. This is the same static electricity that may be painfully experienced by a person who walks across a carpet on a dry day and then touches a grounded metal object. In an isolated IC, ESD acts as a brief power supply for one or more pads, while the other pads remain floating, or grounded. Because the other pads are grounded, when ESD acts as a power supply at a randomly selected pad, the protection circuit acts differently then it does when the IC is operating normally. When an ESD event occurs, the protection circuit must quickly become conductive so that the electrostatic charge is conducted to VSS or ground and is thus dissipated before damaging an internal circuit.

ESD protection circuit, therefore, has two states: normal operation mode and ESD mode. When an IC is in the normal operation mode, the ESD protection circuit appears invisible to the IC by blocking current through itself. In the ESD mode, the ESD protection circuit serves its purpose of protecting the IC by conducting an electrostatic charge quickly to VSS, or ground, before damaging the internal circuit.

However, a typical ESD protection circuit may not be able to dissipate ESD pulses fast enough before damaging charges flow into the internal circuit. This can cause damage to the IC. In order to ensure that protective transistors in the ESD protection circuit turn on before any damage can be done to an IC, the trigger-on voltage of those transistors may need to be adjusted. By lowering the trigger-on voltage, the transistor can turn on much sooner, thus allowing quicker dissipation of the ESD current.

It is always desirable to have faster dissipation of ESD current during an ESD event before harmful charges can damage the IC.

SUMMARY

An embodiment of this invention discloses an electrostatic discharge (ESD) protection circuit that comprises a substrate of a predetermined type, at least one MOS transistor being coupled to a pad of an integrated circuit for dissipating an ESD current from the pad during an ESD event, a substrate contact region, and at least one floating diffusions formed in a substrate area between the MOS transistor and the substrate contact region for reducing a trigger-on voltage of the MOS transistor during the ESD event. As a alternative to embodiment, at least one capacitor is coupled to the floating diffusion region for further reducing the trigger-on voltage during the ESD event.

The construction and method of operation of the invention, however, together with additional objects and advantages thereof will be best understood from the following descriptions of specific embodiments when read in connection with the accompanying figures.

DESCRIPTION

This invention discloses an ESD protection circuit having at least one floating diffusion region for reducing the trigger-on voltage required for dissipating ESD current during an ESD event. Thus, the disclosed ESD protection circuit is able to achieve an improved performance of protecting a core circuit of an IC.

Figure 1A:
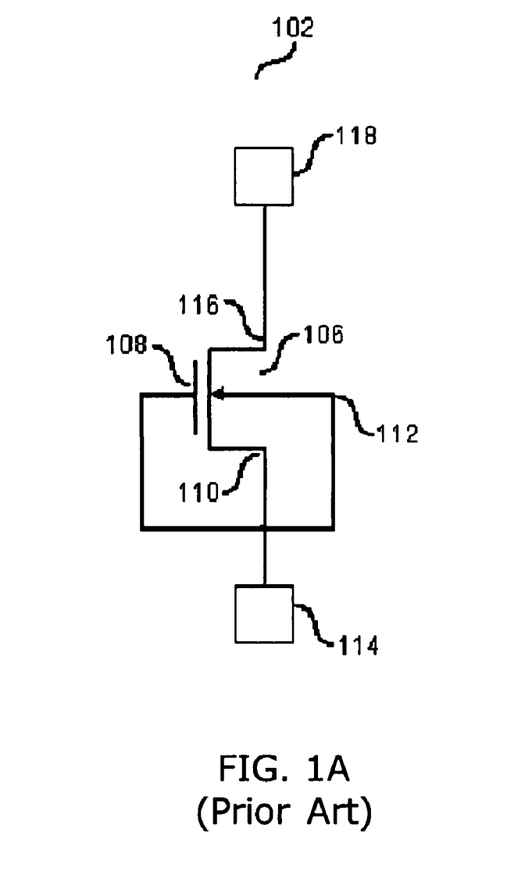
FIG. 1A illustrates a conventional ESD protection circuit.
Figure 1B:
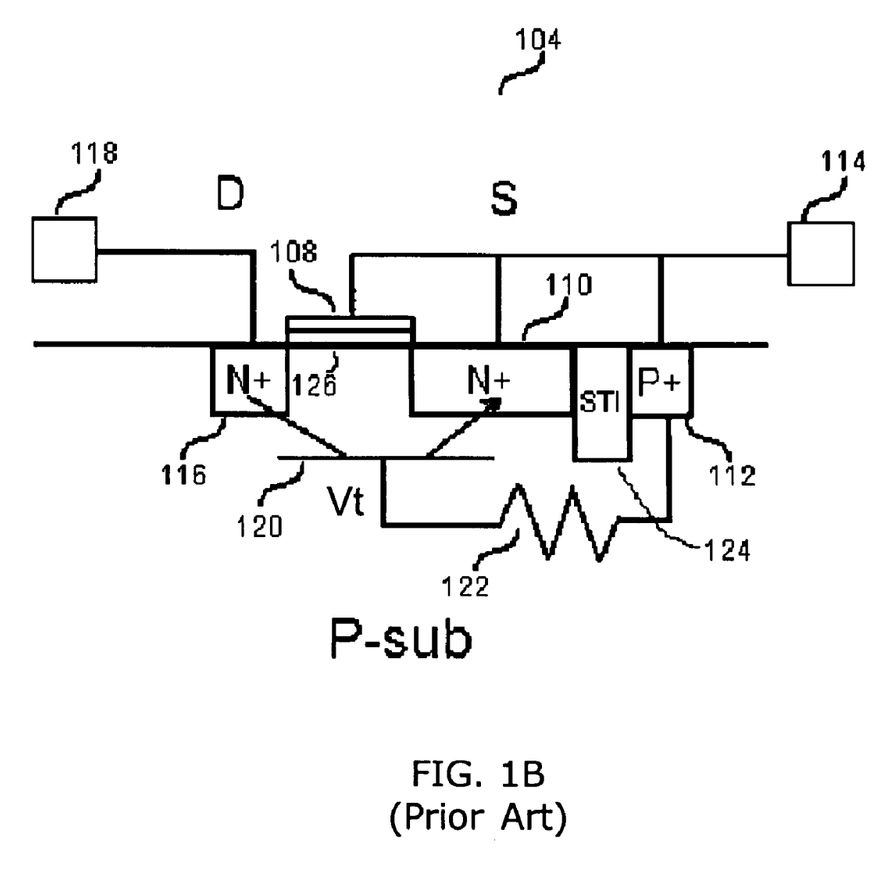
FIG. 1B illustrates a cross-sectional view of the conventional ESD protection circuit.

FIG. 1A illustrates a conventional ESD protection circuit 102, while FIG. 1B illustrates a cross-sectional view 104 of the parasitic lateral NPN bipolar transistor of the ESD protection circuit 102.

The ESD protection circuit 102 protects an IC by utilizing a grounded gate NMOS transistor 106 to provide a path for dissipating ESD current. The ESD protection circuit 102 is placed in parallel with the IC that is to be protected from an ESD event. A gate 108, a source 110, and a P+ substrate contact 112 of the NMOS transistor 106 are all tied together and connected to a pad 114, which is typically grounded. A drain 116 of the NMOS transistor 106 is tied to a pad 118 of the IC, such that the ESD protection circuit 102 can protect the IC by drawing the ESD current to ground when the NMOS transistor 106 turns on during an ESD event.

In the cross-sectional view 104, the parasitic lateral NPN bipolar transistor of the ESD protection circuit 102 is shown. Both the drain 116 and the source 110 of the NMOS transistor 106 are represented by N+ diffusions. A base 120 is connected to the P+ substrate contact 112 through a substrate resistor 122. The N+ diffusion for the source 110 and the P+ substrate contact 112 are separated by a shallow trench isolation 124. At the gate 108, a channel region 126 between the drain 116 and the source 110 conducts the drain-source current, which is needed in order to dissipate the ESD current during an ESD event. The pad 118 of the IC is connected to the drain 116, while the gate 108, the source 110 and the P+ substrate contact 112 are connected to the pad 114.

The ESD protection circuit 102 functions in two modes of operation: the normal operation mode and ESD mode. During the normal operation mode, source supply will apply power to VDD and VSS lines of the IC; and the voltage at the pad 118 is permitted to vary between VDD and VSS. Due to the grounded gate, the NMOS transistor 106 will remain "OFF." This allows normal operation for the IC since the pad 118 is free to respond to normal circuit conditions.

When an ESD event occurs, the incoming voltage at the pad 118 will be significantly higher than VDD with respect to VSS. This will cause the drain-source voltage of the NMOS transistor 106 to increase rapidly above VDD voltage. The reverse bias voltage at the PN junction formed between the drain 116 and the P– substrate will be increased by the large voltage at the drain 116 of the NMOS transistor 106. The reverse bias voltage will reach high enough, to a point where the reverse bias junction undergoes a breakdown, thereby allowing current to flow between the drain 116 and the source 110. This voltage level is called trigger-on voltage. This will cause the PN junction between the channel region 126 and the source 110 to become forward biased, thereby forcing the NMOS transistor 106 to conduct. In this situation, the NMOS transistor 106, which is conducting, allows the dissipation of ESD current to the pad 114 before a harmful current damages the IC.

As discussed in the background, it is desirable to reduce the trigger-on voltage of the conventional ESD protection circuit, so as to enhance its performance.

Figure 2A:
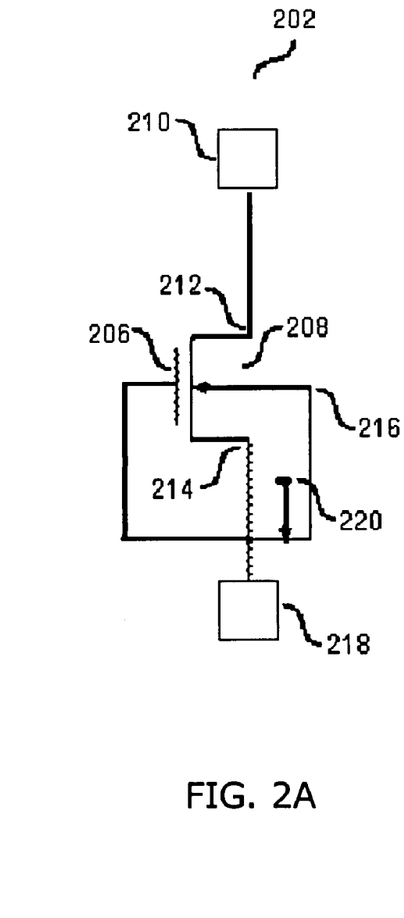
FIG. 2A illustrates an ESD protection circuit with a floating diffusion region, in accordance with a first embodiment of the present invention.
Figure 2B:
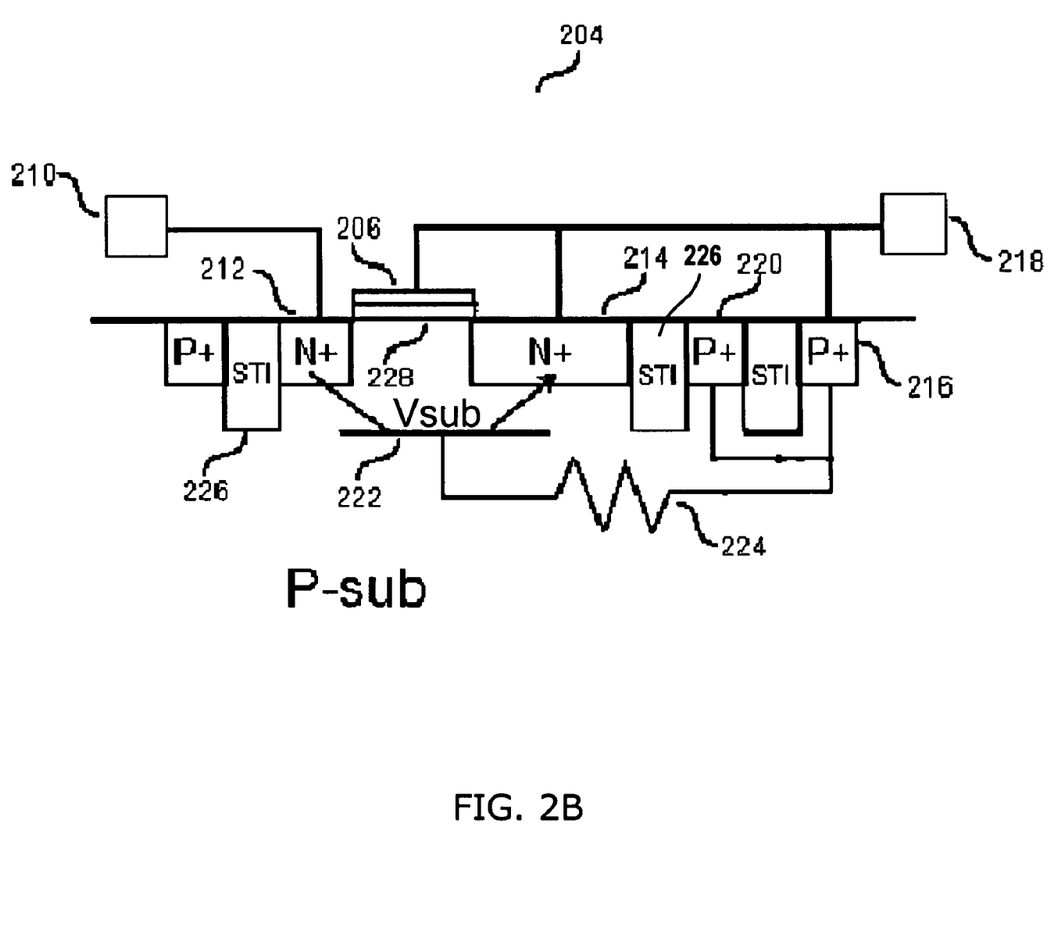
FIG. 2B illustrates a cross-sectional view of the ESD protection circuit, in accordance with the first embodiment of the present invention.

FIG. 2A illustrates an ESD protection circuit 202 with additional floating diffusion regions implemented, in accordance with a first embodiment of the present invention, while FIG. 2B illustrates a cross-sectional view 204 of the parasitic lateral NPN bipolar transistor of the ESD protection circuit 202. The ESD protection circuit 202 provides a path for discharging ESD charges for ESD protection by having a gate 206 of a NMOS transistor 208 grounded. A pad 210 is the connection to the supply source and the IC, and it is also tied to a drain 212 of the NMOS transistor 208. The gate 206, a source 214, and a P+ substrate contact 216, which is connected to the body of the NMOS transistor 208, are all tied to a pad 218, which is grounded. An extra P+ floating diffusion region 220 is connected to the P+ substrate contact 216 through the substrate to provide an extra substrate current that flows through the bulk of the substrate, thereby lowering the trigger-on voltage for the NMOS transistor 208 during an ESD event.

In the cross-sectional view 204, the parasitic lateral NPN bipolar transistor of the ESD protection circuit 202 is shown. The drain 212 and the source 214 of the NMOS transistor 208 are represented by the N+ diffusions. The drain 212 is connected to the pad 210, which is the connection to the supply source and the IC. A base 222 is connected to the P+ substrate contact 216 through a substrate resistor 224. The P+ floating diffusion region 220 is also connected to the P+ substrate contact 216. The P+ floating diffusion region 220 is located closer to the source 214 than the drain 212. Likewise, the P+ substrate contact 216 is located closer to the source 214 than the drain 212. Shallow Trench Isolations (STI) 226 separate the P+ floating diffusion region 220 from the source 214 and the P+ substrate contact 216. At the gate 206, a channel region 228 is set between the drain 212 and the source 214 to conduct the drain-source current, which is needed in order to dissipate ESD charges during an ESD event. The gate 206, the source 214 and the P+ substrate contact 216 are connected to ground 218.

During a normal operation mode, source supply will apply power to the VDD and the VSS lines of the IC, and the voltage at the pad 210 may vary between VDD and VSS. Due to the grounded gate, the NMOS transistor 208 will remain "OFF," thereby allowing the normal operation of the IC, since the pad 210 is free to respond to normal circuit conditions.

When an ESD event occurs, the incoming positive voltage at the pad 210 will be much higher than VDD with respect to VSS, thereby causing the drain-source voltage of the NMOS transistor 208 to increase rapidly above VDD voltage. The reverse bias voltage at the PN junction formed between the drain 212 and the P– substrate will be increased by the large voltage at the drain 212. The reverse bias voltage will reach high enough to a point where the reverse bias junction undergoes a breakdown, thereby allowing current to flow between the drain 212 and the source 214. This will cause the PN junction between the channel region 228 and the source 214 to become forward biased, thereby forcing the NMOS transistor 208 to conduct.

The extra P+ floating diffusion region 220 that is connected to the P+ substrate contact 216 reduces the trigger-on voltage of the NMOS transistor 208. For illustration purposes, Vsub denotes the voltage at the base of the parasitic NPN bipolar transistor constituted by the source 214, the drain 212 and the P-substrate. R denotes the resistance of the substrate resistor 224 determined by the P-substrate. The total current "Isub" flowing through the P-substrate conceptually has two components, one through the bulk of the P+ substrate contact 216 ($I_{224}$) and another from the floating diffusion region 220 to the P+ substrate contact ($I_{220}$). The current $I_{224}$ is referred to as the substrate current as it flows through the bulk of the substrate while the current $I_{220}$ is added to provide extra substrate current. In other words, the total current Isub becomes $I_{224}$ plus $I_{220}$. They act according to the following equations:

$$V\text{sub} = (I_{224} + I_{220})R$$

$$V\text{on} = I_{224} * R$$

where Von is the turn on voltage of the parasitic NPN bipolar transistor. Given that Vsub and R are constants, Isub is constant in an ESD event. The extra $I_{220}$ let MOS transistor to reach trigger-on voltage more easily. In other words, having the floating diffusion region adds a current path and would reduce the substrate current $I_{224}$ that flows through the bulk of the substrate which has a resistance. This in turn reduces the turn on voltage Von so that it helps to turn on the parasitic NPN bipolar transistor quicker than usual. When the bipolar transistor is turned on, the MOS transistor is also driven to dissipate the ESD current. Thus, in effect, it reduces the trigger-on voltage of the NMOS transistor 208 during an ESD event.

Figure 2C:
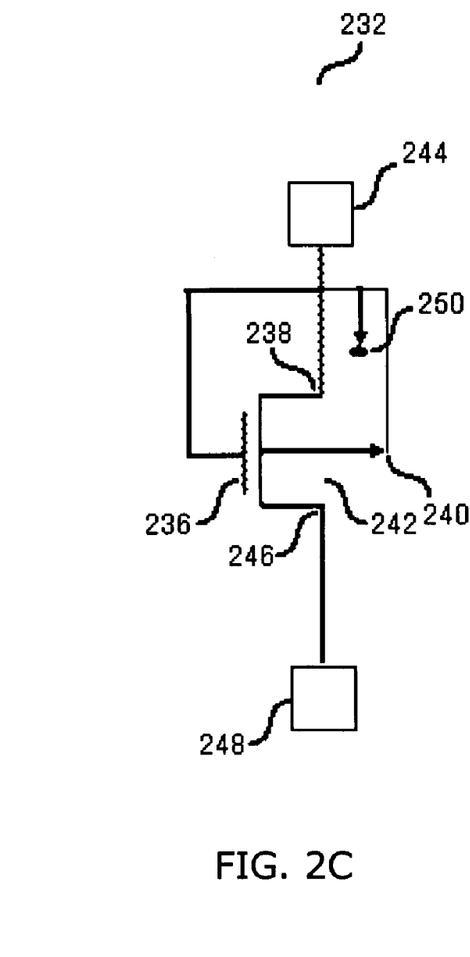
FIG. 2C illustrates an ESD protection circuit with a floating diffusion region, in accordance with a second embodiment of the present invention.
Figure 2D:
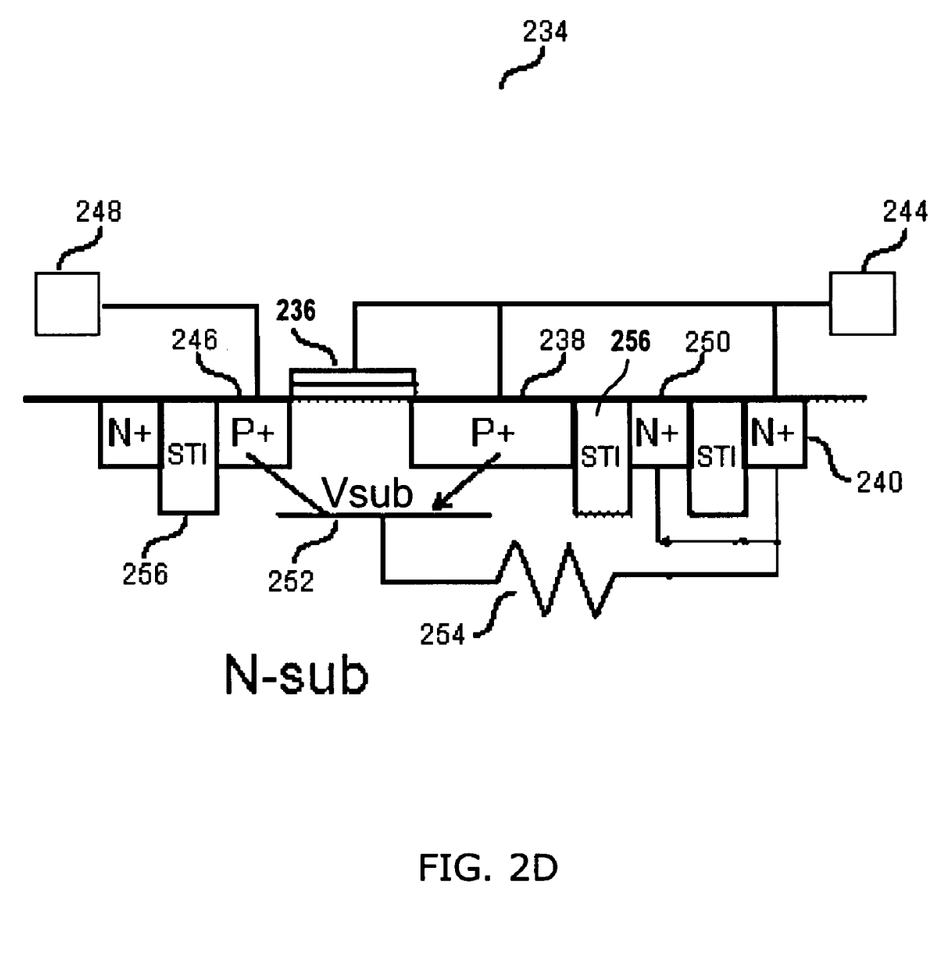
FIG. 2D illustrates a cross-sectional view of the ESD protection circuit, in accordance with the second embodiment of the present invention.

FIG. 2C illustrates an ESD protection circuit 232 with additional N+ floating diffusion regions implemented, in accordance with the second embodiment of the present invention, while FIG. 2D illustrates a cross-sectional view 234 of the parasitic lateral PNP bipolar transistor of the ESD protection circuit 232, in accordance with this embodiment of the present invention.

In the ESD protection circuit 232, a gate 236, a source 238 and a N+ substrate contact 240 of a PMOS transistor 242 are connected to a pad 244, which leads to the IC and the supply source VDD. A drain 246 is connected to a pad 248, which is grounded. An extra N+ floating diffusion region 250 is connected to the N+ substrate contact 240 through the N-substrate for the purpose of reducing the trigger-on voltage of the PMOS transistor 242 during an ESD event.

In the cross-sectional view 234, the parasitic lateral PNP bipolar transistor of the ESD protection circuit 232 is shown. The P+ diffusions are used to serve as the drain 246 and the source 238. A base 252 is connected to the N+ substrate contact 240 and the extra N+ floating diffusion region 250 through a substrate resistor 254. Shallow trench isolations 256 are implemented between all P type and N type materials to decrease chances of interference. The pad 248 is connected to the drain 246. The gate 236, the source 238 and the N+ substrate contact 240 are connected to the pad 244, or VDD.

During the normal operation of the IC, source VDD supplies a voltage to the pad 244. The high voltage will reach the gate 236, thereby turning off the PMOS transistor 242. This allows normal operation for the IC.

When an ESD event occurs, a transient voltage appears at the pad 244, or VDD. The transient voltage will be fed to the source 238, thereby creating a large variation compared to the voltage at the gate 236 and the N+ substrate contact 240. This will lead to a PNP bipolar reverse breakdown, thereby turning the PMOS transistor 242 "ON." Once the PMOS transistor 242 is turned "ON," the ESD pulse will be shorted between the pad 248 and the pad 244, thereby protecting the IC circuit.

As discussed above, the bigger the floating diffusion current generated by the floating diffusion region 250, the smaller the trigger on current that flows through the bulk of the substrate. Thus, similar to the first embodiment, the N+ floating diffusion region 250 helps to turn on the parasitic PNP bipolar transistor, and reduces the trigger-on voltage of the PMOS transistor 242 during an ESD event.

Figure 3:
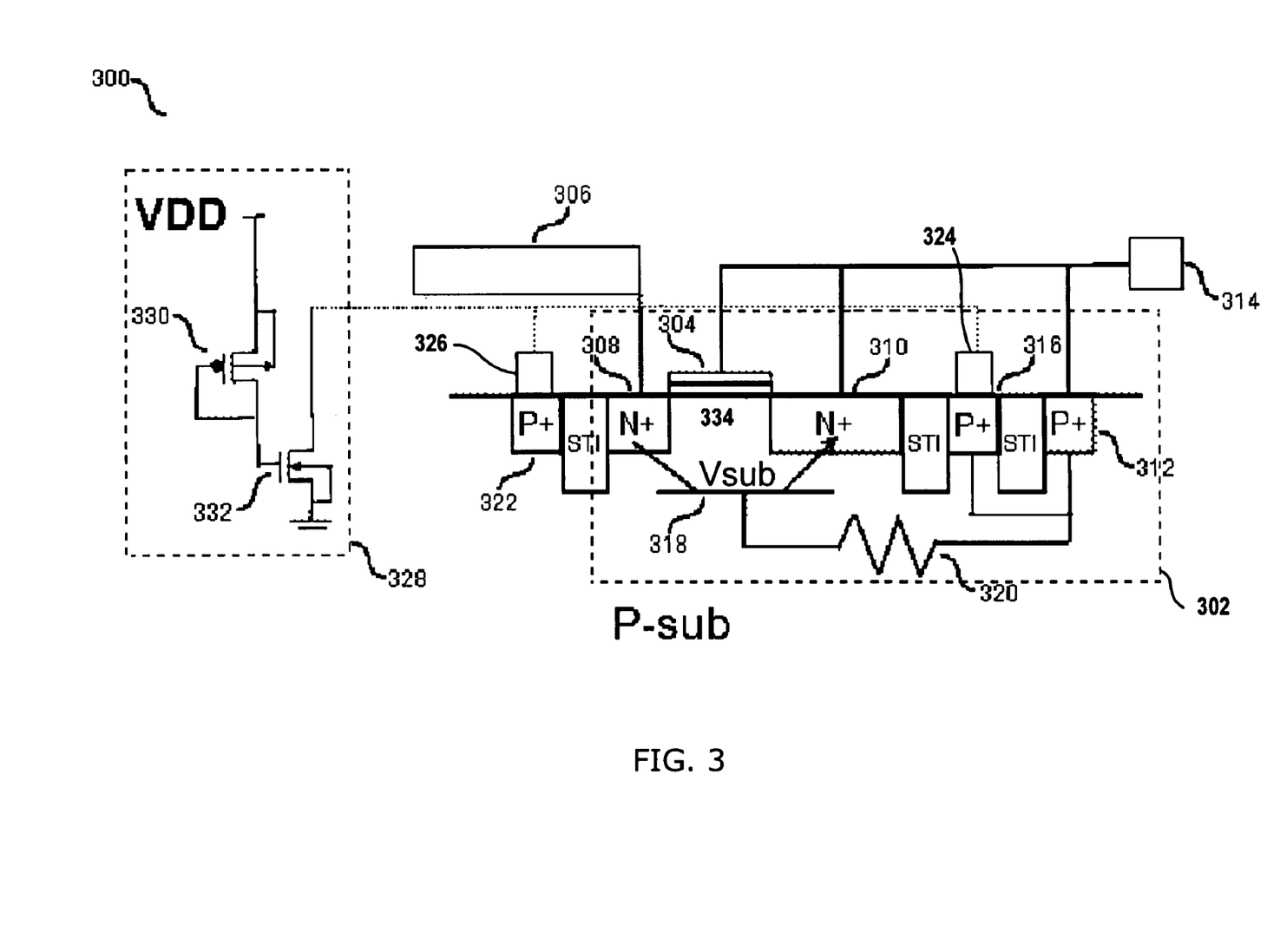
FIG. 3 illustrates an ESD protection circuit with a floating diffusion region connected with a tie-low (TieL) circuit to reduce off current in normal operation condition, in accordance with a third embodiment of the present invention.

FIG. 3 illustrates an ESD protection circuit 300 with additional P+ floating diffusion regions and metal capacitors implemented to further reduce the trigger-on voltage of a NMOS transistor 302, in accordance with the third embodiment of the present invention.

The ESD protection circuit 300 provides a path for discharging ESD charges for ESD protection by having an additional capacitance device for absorbing the charges. A metal element 306 (interchangeably, pad 306) is also tied to a drain 308 of the NMOS transistor 302. The gate 304, a source 310, and a P+ substrate contact 312, which is connected to the body of the NMOS transistor 302, are all tied to a pad 314, which is ground, or VSS. An extra P+ floating diffusion region 316 is connected to the P+ substrate contact 312 to provide an extra substrate current, thereby lowering the trigger-on voltage for the NMOS transistor 304 during an ESD event. A base 318 is tied to the P+ substrate contact 312 through a substrate resistor 320. As shown, a metal contact 326 may be made to the P+ floating diffusion region 322, which form the capacitor between the metal element 306 and the metal contact 326. Although it is not shown, similar capacitance device can be formed over the P+ floating diffusion region 316 by using another metal element similar to the metal element 306 as long as there is a separate material there between. Also, the shape of the metal element 306 does not have to be a standing-alone metal bar, it can be "wrapping around" the contact 326 with portions of it contacting the substrate surface as long as there is a separation material between the contact 326 and the metal element 306. In addition, although the metals are the most popular materials in semiconductor manufacturing for forming capacitors as multiple metal layers are processed in sequence during a standard manufacturing flow, other materials can be used to form the capacitance device as well. Once the capacitors are formed over the floating diffusion regions, the capacitors can charge up during ESD events to store more charges or direct more current so that it enhances the function of the floating diffusion regions to turn on the ESD protection transistor. In another embodiment, the capacitor can be controlled by a tie-low circuit 328, which comprises a PMOS transistor 330 and a NMOS transistor 332. The tie-low circuit 328 keeps the capacitor floating during ESD operation, while remains uncharged in normal operation. Note that a tie-high circuit can also be used to control capacitors implemented in a PMOS transistor based ESD protection circuit.

In the normal operation mode, source supply will apply power to VDD and VSS lines of the IC; the voltage at the metal element 306 is permitted to vary between VDD and VSS. Due to the grounded gate, the NMOS transistor 302 remains "OFF." This allows normal operation for the IC, since the metal element 306, which is connected to the output pad of the IC, is free to respond to normal circuit conditions. Diffusion regions 322 and 316 are grounded during normal operation since the NMOS transistor 332 of the tie-low circuit 328 will be turned "ON" due to the voltage supplied by VDD.

During the ESD mode, the incoming positive voltage at the metal element 306 will be much higher than VDD with respect to VSS, causing the drain-source voltage of the NMOS transistor 302 to increase rapidly above VDD voltage. The reverse bias voltage on the PN junction formed between the drain 308 and the P+ substrate contact 312 will be increased by the large voltage at the drain 308 of the NMOS transistor 302. The reverse bias voltage will reach high enough, to a point where the reverse bias junction undergoes a breakdown, thereby allowing current to flow between the drain 308 and the source 310. This will cause the PN junction between the channel region 334 and the source 310 to become forward biased, forcing the NMOS transistor 302 to conduct. The P+ floating diffusion regions 316 and 322 are connected to the P+ substrate contact 312 through the substrate to reduce the trigger-on voltage required for turning on the NMOS transistor 302. To further increase the current through the floating diffusion regions, the capacitors formed by the metal elements 326, 306 and other metal elements are placed on top of both P+ floating diffusion regions 316 and 322. The tie-low circuit 328 controls the diffusion regions 322 and 324, thereby allowing them to be floating as an ESD event occurs. This allows the NMOS transistor 302 to turn on much faster during an ESD event. The NMOS transistor 302 along with a lower substrate current will quickly dissipate any ESD current to the pad 314 before a harmful current damages the IC.

It is noteworthy that the capacitors can be implemented on a PMOS-transistor-based ESD protection circuit in a similar way as discussed above, with some variations. The capacitors are connected to a tie-high circuit that keeps the capacitor uncharged in a normal operation state, and floating during an ESD event.

Figure 4A:
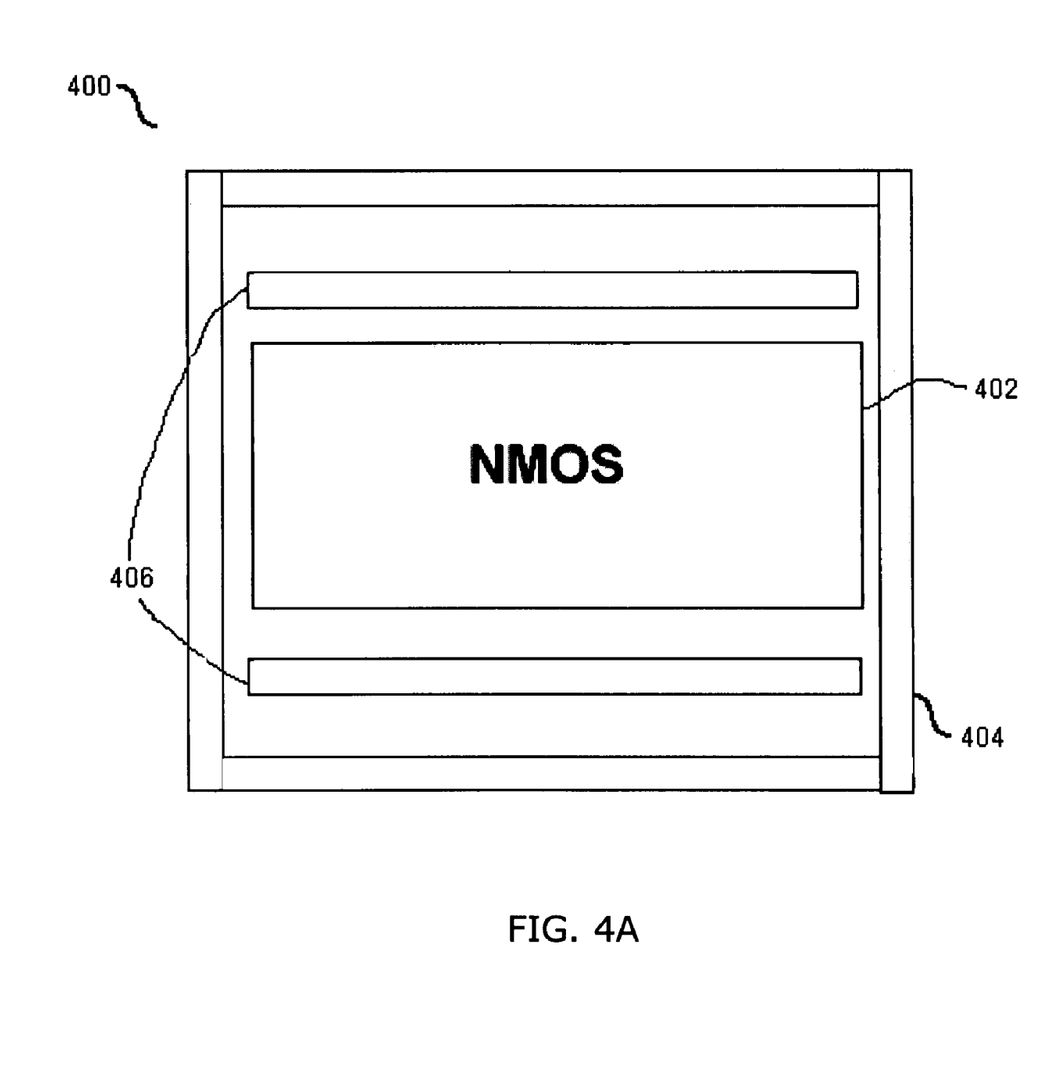
FIG. 4A-4C illustrate layouts of the ESD protection circuit, in accordance with various embodiments of the present invention.

FIG. 4A illustrates a layout 400 of the P+ floating diffusion regions surrounding a NMOS transistor 402, in accordance with the first embodiment of the present invention. The NMOS transistor 402, in FIG. 4A, is equivalent to the NMOS transistor 208 in FIG. 2A. The P+ substrate contacts 404 surround the NMOS transistor 402. In order to reduce the trigger-on voltage of the NMOS transistor 402, extra P+ substrate strips 406 are implemented to be the extra P+ floating diffusion regions, as illustrated in FIG. 2B that are utilized to provide extra substrate current.

Figure 4B:
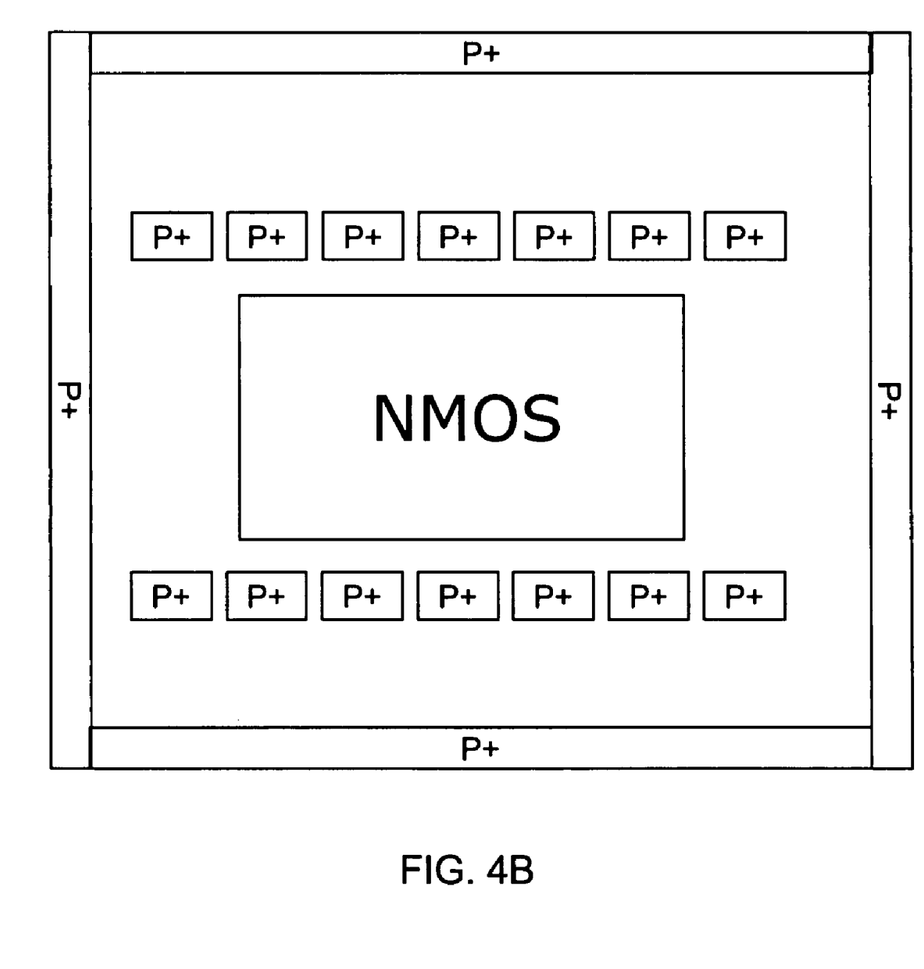
Figure 4C:
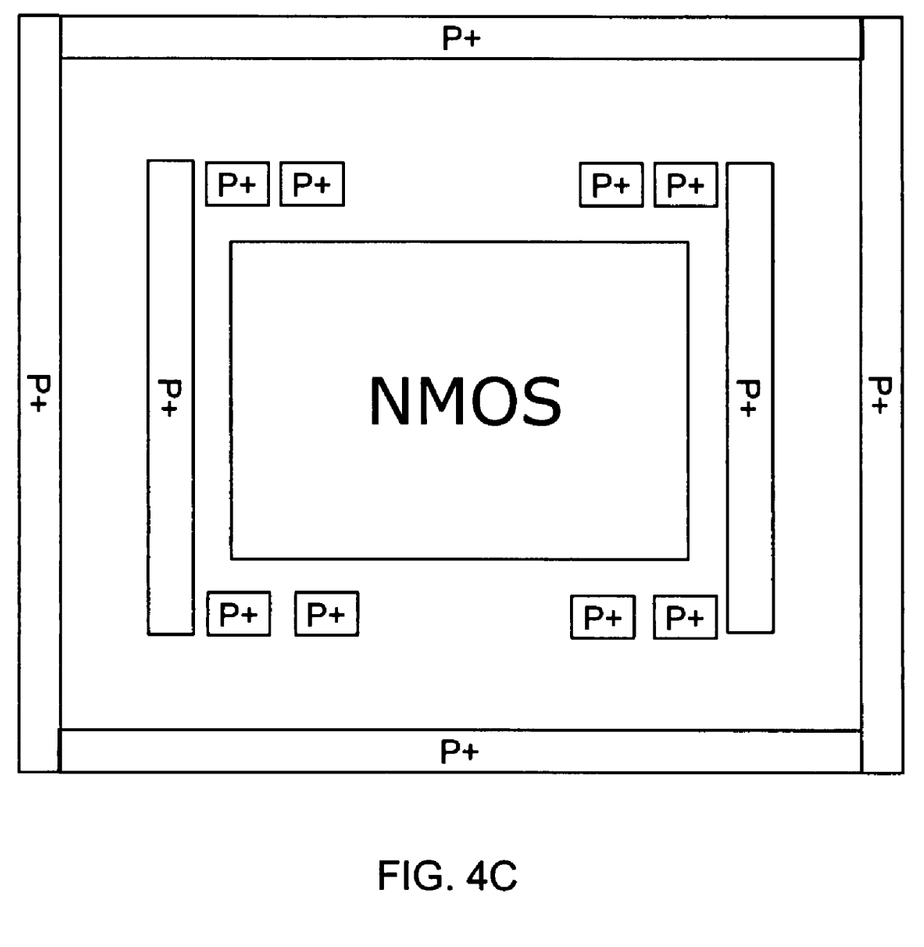

FIGS. 4B and 4C show two other layouts for placing the floating diffusion regions. FIG. 4B shows the floating diffusion regions are discrete diffusion regions aligned together between the substrate contact and the MOS transistor, while FIG. 4C illustrates that the floating diffusion regions can be of a continuous strip shape according to different embodiments of the invention. It is also understood that although only P+ floating diffusion regions are shown for NMOS transistors, N+ floating diffusion regions can be similarly constructed for PMOS transistors.

Figure 4D:
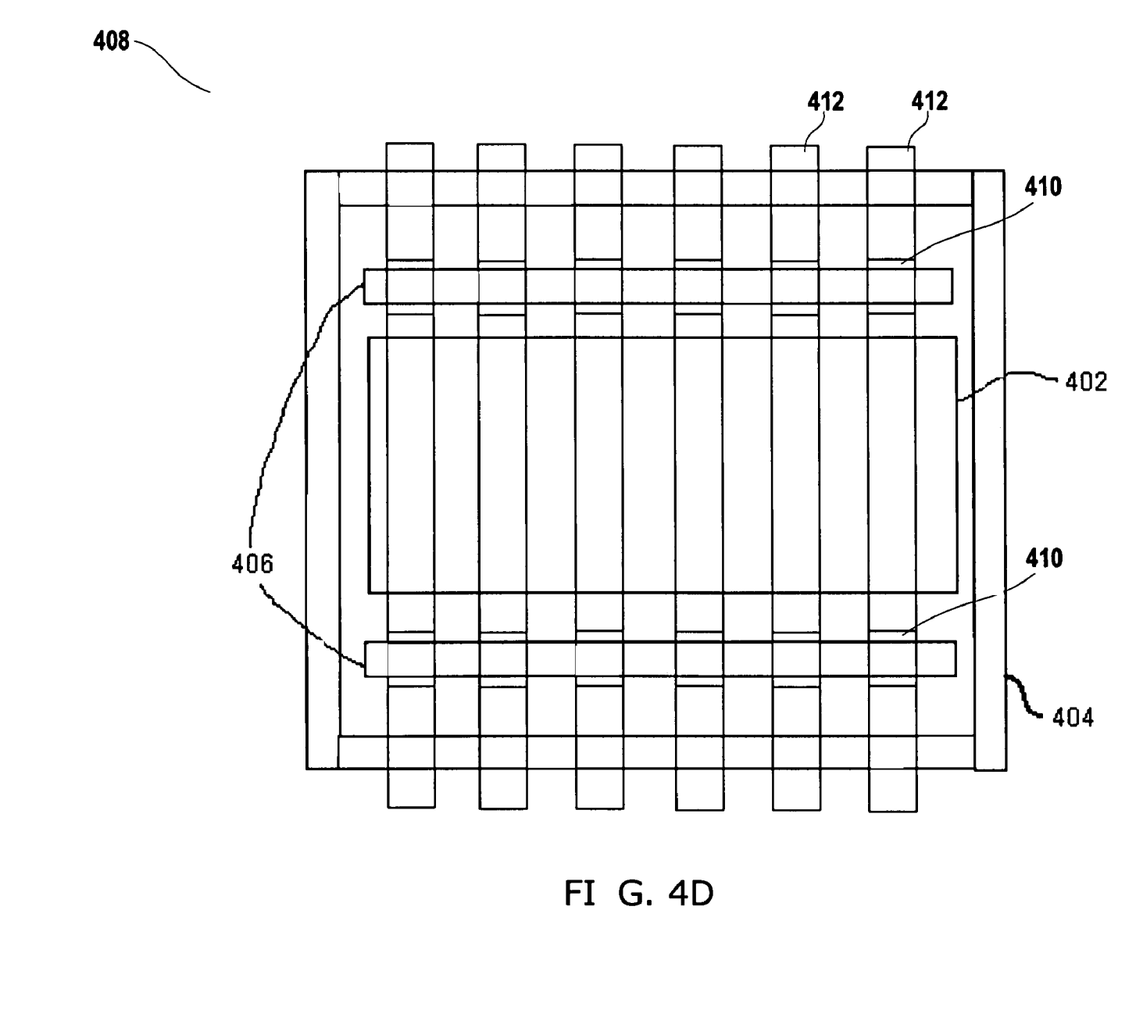
FIG. 4D illustrates a layout of the ESD protection circuit with metal capacitors, in accordance with another embodiment of the present invention.

FIG. 4D presents a layout 408 modified from the placement structure 400. The placement structure includes metals 410 and 412 required, respectively, for the capacitors and contacts that are laid on top of the NMOS transistor 402, the P+ substrates 404 and the extra P+ substrate strips 406. The metals 410 are implemented on top of the P+ substrate strips 406, which are the floating diffusion regions, on both sides of the NMOS transistor 402. Capacitors are thus created to provide extra substrate current to lower the trigger-on voltage of the NMOS transistor 402. Metals 412 are placed across the NMOS transistor 402 for metal wiring to connect the source of the NMOS transistor 402 to VDD and the IC. In FIGS. 4A-4D, the floating diffusion regions are placed within the area defined by the substrate contacts in a guard ring form. Thus, the floating contacts and capacitors would not occupy extra areas.

This invention provides additional floating diffusion regions to the substrate of the transistor in an ESD protection circuit to reduce the substrate current. The trigger voltage required to turn on the transistor is lowered. This allows the transistor to turn on earlier in an ESD event, thereby providing better protection for the IC. By implementing capacitors on top of additional floating diffusion regions, trigger voltage required for turning on a transistor is further reduced.

The above illustrations provide many different embodiments for implementing different features of this invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrostatic discharge (ESD) protection circuit comprising:
   at least one MOS transistor coupled to a pad of an integrated circuit for dissipating an ESD current from the pad during an ESD event;
   a substrate having a contact region;
   at least one floating diffusion region formed in the substrate between the MOS transistor and the substrate contact region, wherein the contact region and the at least one floating diffusion region have the same dopant type; and
   a first isolation structure and a second isolation structure placed between the MOS transistor and the substrate contact region wherein said at least one floating diffusion region directly contacts said first isolation structure and said second isolation structure.

2. The ESD protection circuit of claim 1 wherein the floating diffusion region provides an extra substrate current flowing through the substrate during the ESD event.

3. The ESD protection circuit of claim 1 wherein the floating diffusion region is of a strip shape.

4. The ESD protection circuit of claim 1 wherein the floating diffusion region is rectangular.

5. The ESD protection circuit of claim 1 wherein the MOS transistor is a NMOS transistor with the drain connected to the pad and the source connected to ground.

6. The ESD protection circuit of claim 5 wherein the floating diffusion region is a P-type diffusion region.

7. The ESD protection circuit of claim 1 wherein the MOS transistor is a PMOS transistor with its drain connected to ground and its source connected to the pad.

8. The ESD protection circuit of claim 7 wherein the floating diffusion region is a N-type diffusion region that provides an extra substrate current during the ESD event.

9. The ESO protection circuit of claim 1 wherein the floating diffusion region is closer to a source region of the MOS transistor than a drain region thereof.

10. The ESD protection circuit of claim 1 wherein the substrate contact is a guard ring.

11. The ESD protection circuit of claim 1 further comprising at least one capacitor coupled to the floating diffusion region for enhancing an extra substrate current during the ESD event.

12. An electrostatic discharge (ESD) protection circuit comprising;
   a guard ring forming a substrate contact region in a substrate:
   at least one MOS transistor coupled to a pad of an integrated circuit for dissipating an ESD current from the pad during an ESD event;
   at least one floating diffusion region formed in the substrate between the MOS transistor and the substrate contact region, wherein the substrate contact region and the at least one floating diffusion region have the same dopant type; and
   a first isolation structure and a second isolation structure placed between the MOS transistor and the substrate contact region wherein said at least one floating diffusion region directly contacts said first isolation structure and said second isolation structure.

13. The ESD protection circuit of claim 12 wherein the floating diffusion region provides an extra substrate current flowing through a bulk of the substrate during the ESD event, thereby turning on the MOS transistor at the reduced trigger-on voltage.

14. The ESD protection circuit of claim 12 wherein the MOS transistor is a NMOS transistor with the drain connected to the pad and the source connected to ground, and wherein the floating diffusion region is a P-type diffusion region.

15. The ESD protection circuit of claim 12 wherein the MOS transistor is a PMOS transistor with its drain connected to ground and its source connected to the pad, and wherein the floating diffusion region is a N-type diffusion region.

16. The ESD protection circuit of claim 12 wherein the floating diffusion region is closer to a source region of the MOS transistor than a drain region thereof.

17. The ESD protection circuit of claim 12 further comprising at least one capacitor coupled to the floating diffusion region for enhancing an extra substrate current during the ESD event.

18. An electrostatic discharge (ESD) protection circuit comprising:
   a substrate having a contact area;
   at least one MOS transistor coupled to a pad of an integrated circuit for dissipating an ESD current from the pad during an ESD event;
   at least one floating diffusion region formed in the substrate between the MOS transistor and the substrate contact region and coupled to at least one capacitance device, wherein the contact area and the at least one floating diffusion region have the same dopant type; and
   a first isolation structure and a second isolation structure placed between the MOS transistor and the substrate contact region wherein said at least one floating diffusion region directly contacts said first isolation structure and said second isolation structure.

19. The ESD protection circuit of claim 18 wherein the MOS transistor is a NMOS transistor with the drain connected to the pad and the source contected to ground, and wherein the floating diffusion region is a P-type diffusion region.

20. The ESD protection circuit of claim 18 wherein the MOS transistor is a PMOS transistor with its drain connected to ground and its source connected to the pad, and wherein the floating diffusion region is a N-type diffusion region.

21. The ESD protection circuit of claim 18 wherein the floating diffusion region is closer to a source region of the MOS transistor than a drain region thereof.

22. An electrostatic discharge (ESD) protection circuit comprising:
   at least one MOS transistor coupled to a pad of an integrated circuit for dissipating an ESD current from the pad during an ESD event;
   a first diffusion region directly connected to the MOS transistor br dissipating the ESD current from the pad;
   a second diffusion region connected to the first diffusion region for dissipating the ESD from the pad, wherein the first diffusion region and the second diffusion region have the same dopant type; and
   an isolation structure directly contacting the first diffusion region and the second diffrsion region;
   wherein the second diffusion region does not directly contact a diffusion region of the MOS transistor.

* * * * *

UNITED STATES PATENT AND TRADEMARK OFFICE
CERTIFICATE OF CORRECTION

PATENT NO. : 7,323,752 B2
APPLICATION NO. : 10/956795
DATED : January 29, 2008
INVENTOR(S) : Yu-Hung Chu, Shao-Chang Huang and Ming-Hsiang Song Page 1 of 1

It is certified that error appears in the above-identified patent and that said Letters Patent is hereby corrected as shown below:

Column 8, line 42, delete "ESO" and insert -- ESD -- therefor.

Column 8, line 52, delete "comprising;" and insert -- comprising: -- therefor.

Column 8, line 54, delete "substrate:" and insert -- substrate; -- therefor.

Column 10, line 6, delete "contected" and insert -- connected -- therefor.

Column 10, line 23, delete "br" and insert -- for -- therefor.

Column 10, line 29, delete "diffrsion" and insert -- diffusion --.

Signed and Sealed this

Third Day of June, 2008

JON W. DUDAS
*Director of the United States Patent and Trademark Office*